US009355774B2

(12) United States Patent
Mathieu et al.

(10) Patent No.: US 9,355,774 B2
(45) Date of Patent: May 31, 2016

(54) SYSTEM AND METHOD FOR MANUFACTURING MAGNETIC RESONANCE IMAGING COILS USING ULTRASONIC CONSOLIDATION

(71) Applicant: General Electric Company, Schenectady, NY (US)

(72) Inventors: Jean-Baptiste Mathieu, Clifton Park, NY (US); Yanzhe Yang, Schenectady, NY (US); Bruce Courtney Campbell Amm, Clifton Park, NY (US); Silke Maria Lechner-Greite, Munich (DE)

(73) Assignee: General Electric Company, Niskayuna, NY (US)

( * ) Notice: Subject to any disclaimer, the term of this patent is extended or adjusted under 35 U.S.C. 154(b) by 103 days.

(21) Appl. No.: 13/730,419

(22) Filed: Dec. 28, 2012

(65) Prior Publication Data

US 2014/0184372 A1    Jul. 3, 2014

(51) Int. Cl.
| | | |
|---|---|---|
| H01F 27/08 | (2006.01) |
| H01F 27/10 | (2006.01) |
| H01F 1/00 | (2006.01) |
| H01F 41/00 | (2006.01) |
| H01F 27/28 | (2006.01) |
| G01R 33/385 | (2006.01) |

(52) U.S. Cl.
CPC ............ H01F 41/00 (2013.01); G01R 33/3856 (2013.01); G01R 33/3858 (2013.01); H01F 27/2876 (2013.01); *Y10T 29/4902* (2015.01); *Y10T 29/51* (2015.01)

(58) Field of Classification Search
CPC ..... H01F 27/08; H01F 41/00; H01F 27/2876; H01F 27/322; H01F 27/306; H01F 27/245; H01F 27/10; H01F 27/324; G01R 33/3856; Y10T 29/4902

USPC .................... 336/60, 55, 56, 57, 58; 335/216
See application file for complete search history.

(56) References Cited

U.S. PATENT DOCUMENTS

| | | | | |
|---|---|---|---|---|
| 3,183,461 | A * | 5/1965 | Tipton ............................ 336/60 |
| 4,840,700 | A * | 6/1989 | Edelstein ............. G01R 33/385 216/22 |
| 5,170,319 | A * | 12/1992 | Chao-Fan Chu et al. ..... 361/689 |
| 6,253,835 | B1 * | 7/2001 | Chu et al. ..................... 165/80.4 |
| 6,519,500 | B1 * | 2/2003 | White ............................ 700/119 |
| 7,023,312 | B1 * | 4/2006 | Lanoue ................. H01F 27/085 336/60 |
| 7,382,131 | B2 | 6/2008 | Eberler et al. |
| 7,548,064 | B1 * | 6/2009 | Wang ................. G01R 33/3858 324/309 |

(Continued)

OTHER PUBLICATIONS

Urdaneta, M.G., et al.; "Goodbye Wires and Formers: 3-D Additive Manufacturing and Fractal Cooling Applied to Construction of MRI Gradient Coils", IEEE Nuclear Science Symposium and Medical Imaging Conference (NSS/MIC), Oct. 23-29, 2011, 2479-2482.

Hernandez, Ludwing A.; "Integration & Process Planning for Combined Ultrasonic Consolidation and Direct Write", Utah State University, Sep. 18, 2009.

(Continued)

*Primary Examiner* — Mangtin Lian
*Assistant Examiner* — Kazi Hossain
(74) *Attorney, Agent, or Firm* — Mellisa K. Dobson

(57) ABSTRACT

The embodiments disclosed herein relate generally to magnetic resonance imaging systems and, more specifically, to the manufacturing of a gradient coil assembly for magnetic resonance imaging (MRI) systems. For example, in one embodiment, a method includes ultrasonically consolidating a plurality of sheets of a conductive material to form a consolidated structure and machining one or more conductive channels into the consolidated structure to form an inductor.

4 Claims, 8 Drawing Sheets

(56) References Cited

U.S. PATENT DOCUMENTS

| | | | |
|---|---|---|---|
| 2007/0040702 A1 | 2/2007 | Mosher et al. | |
| 2007/0177362 A1* | 8/2007 | Fortson | 361/752 |
| 2007/0229206 A1* | 10/2007 | Kit et al. | 336/200 |
| 2007/0247156 A1* | 10/2007 | Schuster | G01R 33/3856 324/318 |
| 2007/0295440 A1* | 12/2007 | Stucker et al. | 156/73.1 |
| 2010/0003158 A1 | 1/2010 | Ando et al. | |
| 2010/0052668 A1* | 3/2010 | Gleich | A61B 5/05 324/239 |
| 2011/0227573 A1* | 9/2011 | Konijn et al. | 324/318 |
| 2012/0074942 A1* | 3/2012 | Hollis | G01R 33/385 324/318 |
| 2012/0075047 A1* | 3/2012 | Luckey et al. | 336/60 |
| 2012/0092105 A1 | 4/2012 | Weinberg et al. | |
| 2012/0132644 A1 | 5/2012 | Gu et al. | |
| 2012/0287577 A1* | 11/2012 | Sevakivi et al. | 361/702 |

OTHER PUBLICATIONS

Johnson, Denton H.; "Uniform Temperature Infrared Targets Using Ultrasonic Consolidation", Utah State University, 2007.

Lane, Brian; "Ultrasonic Additive Manufacturing Puts Together a Metal Mold", Industry Market Trends Machining Journal, Jun. 8, 2012.

Boivie, Klas; "Enhanced Tooling by Additive Manufacturing Technology", SINTEF Product and Production, accessed Mar. 28, 2013.

Winker, Rob; "MRI Scanners: Design & Manufacturing With FDM", Stratasys, Inc., accessed Apr. 2, 2013.

Ultrasonic Consolidation demonstration, http://www.youtube.com/watch?v=gq-JYKG7TQc, May 18, 2012.

Direct Manufacturing: SOLIDICA, http://www.youtube.com/watch?v=5U9OENNjcM0&feature, Jun. 7, 2011.

* cited by examiner

SYSTEM AND METHOD FOR MANUFACTURING MAGNETIC RESONANCE IMAGING COILS USING ULTRASONIC CONSOLIDATION

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Magnetic Resonance Imaging (MRI) systems enable imaging based on a primary magnetic field, a radio frequency (RF) pulse, and time-varying magnetic gradient fields that interact with specific nuclear components in an object, such as hydrogen nuclei in water molecules. The magnetic moments of such nuclear components may generally align with the primary magnetic field, but subsequently process about the bulk magnetic field direction at a characteristic frequency known as the Larmor frequency. An RF pulse at or near the Larmor frequency of such nuclear components may cause their magnetic moments to be rotated. When the RF pulse has ended, the magnetic moments relax and generally align with the primary magnetic field, emitting a detectable signal.

Some of the magnetic gradient fields in MRI are produced by a series of gradient coils. In particular, the gradient coils create magnetic fields of varying strength along various imaging planes to produce a gradient along each plane. Nuclei of interest (e.g., hydrogen) align their spins according to the gradients. This results in spatial encoding, where spatial information about the location of the excited hydrogen nuclei can be obtained during acquisitions. Strong amplifiers power the gradient coils, allowing them to rapidly and precisely adjust the magnetic field gradients.

Generally, gradient coils may be manufactured using hollow copper wires having a constant cross-section, resulting in gradient coils with limited internal and external geometries. In addition, the manner in which the gradient coils are formed may affect their durability. For example, the durability of the gradient coils and repeatability from one coil to another may decrease due to stress resulting from winding or otherwise bending the coils to a desired shape. Furthermore, additional gradient coil features (e.g., soldering pads, connecting leads, jumpers and barbs) are brazed onto the MRI gradient boards. Such a process may compromise the reliability of these features, as over time the brazed joints may fail, resulting in poor gradient and cooling efficiency. Accordingly, a need exists to develop a less costly, reliable high throughput method to manufacture the MRI gradient coils.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the invention. Indeed, the present disclosure may encompass a variety of forms that may be similar to or different from the embodiments set forth below.

In one embodiment, a method of manufacturing MRI gradient coils is provided. The method generally involves ultrasonically consolidating a plurality of sheets of a conductive material to form a consolidation structure, and machining one or more conductive channels into the consolidated structure to form an inductor.

In another embodiment, an ultrasonic consolidating system is provided. In general, the ultrasonic consolidating system includes a plurality of configurable elements that ultrasonically consolidate a plurality of metal layer sheets to one another, a consolidation platform that may support the plurality of metal layer sheets as they are consolidated, and a control system communicatively coupled to the ultrasonic consolidation system, the consolidation platform, or combination thereof. The control system may control the ultrasonic consolidation system, the consolidation platform, or the combination thereof, such that the system produces an inductor having one or more internal fluid paths.

In a further embodiment, an inductor is provided. In general the inductor includes a plurality of ultrasonically consolidated conductive layers defining a curved geometry and one or more internal fluid paths disposed within the curved geometry and may flow a cooling fluid.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
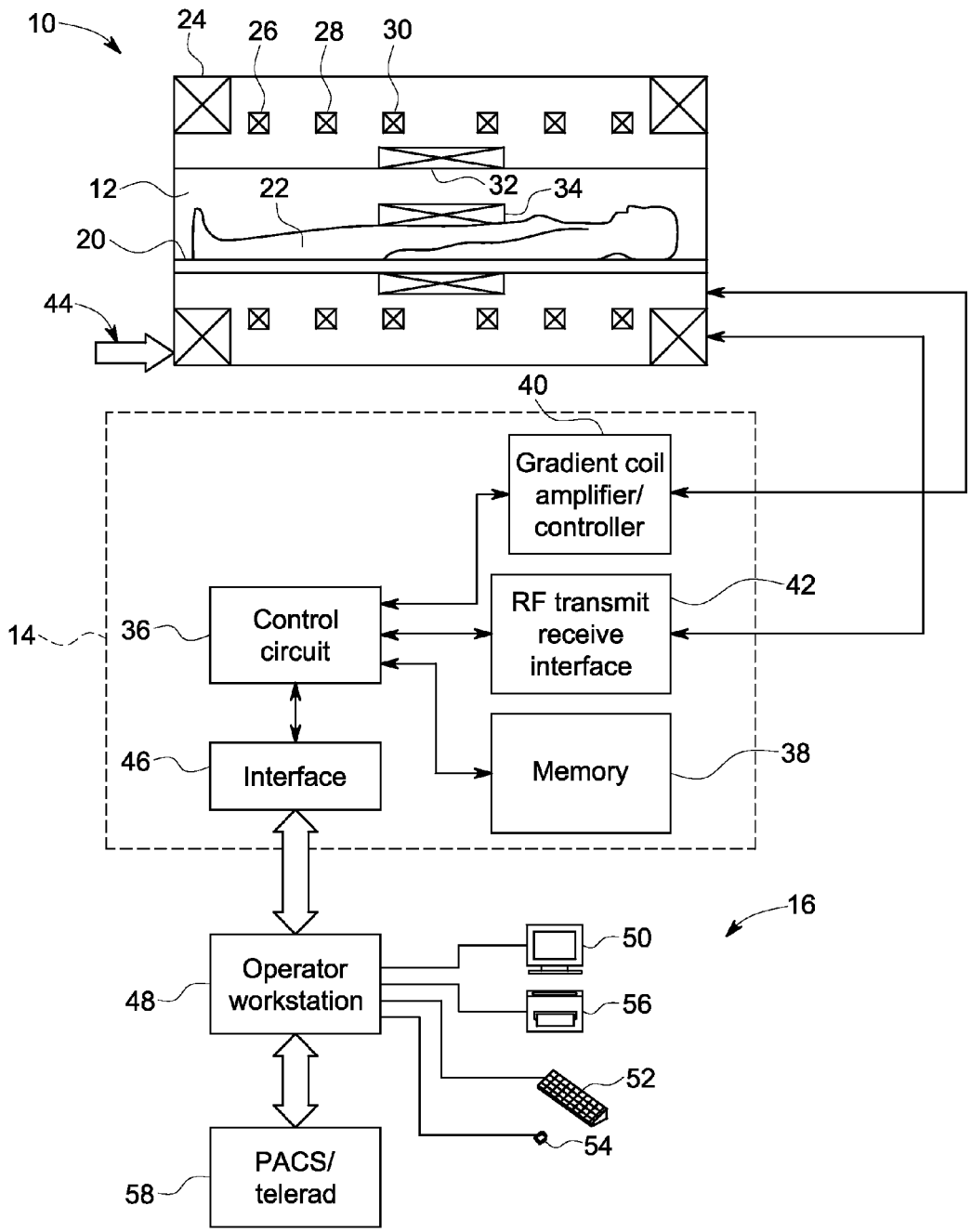
FIG. 1 is an illustration of an embodiment of an MRI system utilizing one or more gradient coils.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, typical methods used to produce gradient coils generally result in gradient coil geometries having unchanging cross-sections. Because the 3D geometry of the gradient coils has a significant impact on the resolution of the produced images, greater flexibility in potential gradient coil designs may be desirable. Indeed, parameters such as gradient and switching efficiency, shielding, and cooling effectiveness, among others, may depend on the structure and geometry of the gradient coils.

To overcome these and other shortcomings of existing approaches, present embodiments utilize ultrasonic consolidation (UC) to generate gradient coils having a wide variety of geometries. Generally, UC enables the deposition of solid metal sheets layer by layer onto a desired surface, providing non-porous 3D structures. In certain implementations, UC employs high frequency ultrasonic vibrations (e.g., approximately 20 kHz, and amplitude between 10 and 50 μm) and force to join metal layers and, with the aid of computer numerical control (CNC) contour milling, machine precise and complex patterns and/or channels into the coils. For example, present embodiments include the production of a gradient coil using layer by layer assembly to vary coil geometries, incorporate complex internal cooling channel patterns, and deposit all electrical connectors and jumpers on a planar or cylindrical substrate without brazed and/or soldered joints.

It may be desirable to manufacture MRI gradient coils in this manner to integrate internal cooling channels into the coils while also having a more compact radial thickness compared to coils constructed using other techniques, such as hand/automated wire winding, etc. In certain embodiments, this can be achieved in an automatic fashion using a suitably programmed controller that controls machining patterns without the need of tooling modifications while enabling 3D deposition of gradient coil board features (e.g. soldering pads, connecting leads, jumpers, barbs, etc.) and avoiding brazed joints resulting in reduced labor and more reliable gradient coils. Moreover, patterning of gradient coil structures can be done directly on a cylindrical surface; hence alleviating stresses caused by rolling and reduces the need for strong interfaces.

Turning now to the drawings, and referring first to FIG. 1, an embodiment of an MRI system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner having a table 20 positioned to place a patient 22 in a desired position for scanning.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field. A series of gradient coils 26, 28 and 30 are grouped in one or more gradient coil assemblies for generating controlled magnetic gradient fields during examination sequences. An RF coil 32 is provided for generating RF pulses for exciting the gyromagnetic material. Power may be supplied to the scanner 12 in any appropriate manner, as indicated generally at reference numeral 44. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils 34 may be provided separate from RF coil 32. Such coils may include structures specifically adapted for target anatomies, such as head coil assemblies. Moreover, receiving coils may be provided in any suitable physical configuration, including phased array coils.

In accordance with an embodiment, the gradient coils 26, 28, and 30 may each be formed using conductive wires, bars, plates or sheets to form a coil structure, which generates a gradient field upon application of control pulses. The placement of the gradient coils 26, 28, and 30 within the gradient coil assembly may be done in several different orders and with varying configurations, and the scanner 12 may further include complementary gradient coils to shield the gradient coils 26, 28, and 30. In some embodiments, the gradient coil 26 may be a z-gradient positioned at an outermost location compared to the gradient coils 28 and 30. The gradient coils 28 and 30 may be x-axis and y-axis coils, respectively.

The gradient coils 26, 28, and 30 of the scanner 12 may be controlled by external circuitry to generate desired fields and pulses, and to read signals from the gyromagnetic material in a controlled manner. The gradient coils 26, 28, and 30 may also serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 may have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and/or phase encoding. These functions can be applied along the x-, y- and z-axes of the original coordinate system or along other axes determined by combinations of pulsed currents applied to the individual field coils.

The coils of the scanner 12 are controlled by the scanner control circuitry 14 to generate the desired magnetic field and radiofrequency pulses. In the embodiment of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 44 in FIG. 1, is provided for energizing the primary magnet 24. Finally, the scanner control circuitry 14 includes interface components 46 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 48 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 48 may further include various interface and peripheral drivers for receiving and exchanging data with local and remote devices. In the illustrated embodiment, such devices include a monitor 50, a conventional computer keyboard 52, and an alternative input device such as a mouse 54. A printer 56 is provided for generating hard copy output of documents and images reconstructed from the acquired data. In addition, the system 10 may include various local and remote image access and examination control devices, represented generally by reference numeral 58 in FIG. 1. Such devices may include picture archiving and communication systems, teleradiology systems, and the like.

Figure 2:
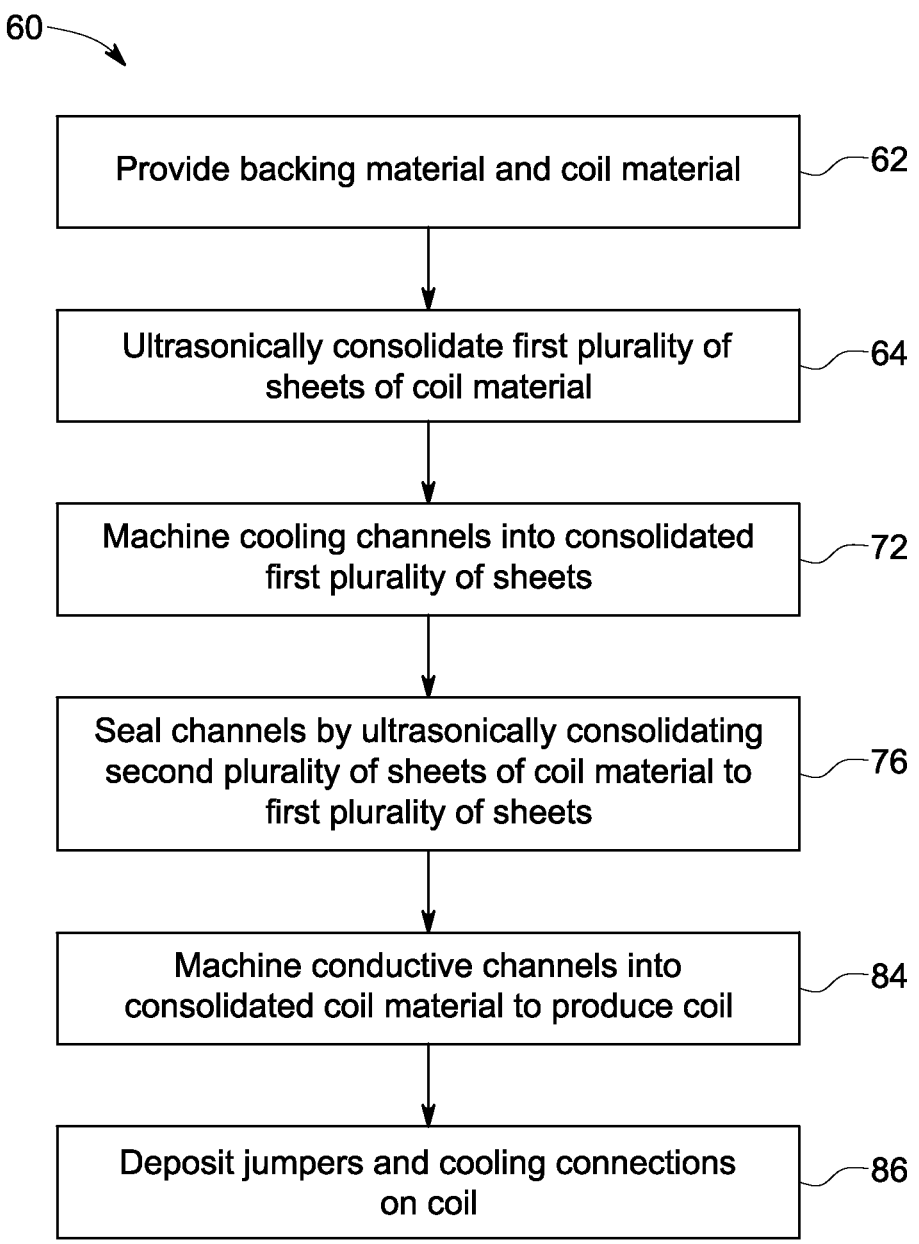
FIG. 2 is a process-flow diagram of an embodiment of a method for manufacturing MRI gradient coils with cooling channels.

As noted above, the present disclosure provides, among other things, techniques that may be used to construct gradient coils, such as the gradient coils 26, 28, and 30, in a manner that enables the coils to a wide variety of geometries. One such approach is depicted in FIG. 2, which illustrates an embodiment of a method 60 to construct the gradient coils 26, 28, and 30 used in the MRI system 10 of FIG. 1. In addition, to facilitate discussion of aspects of the method 60, reference is made to corresponding structures resulting from the acts of the method 60 in FIG. 3.

Figure 3:
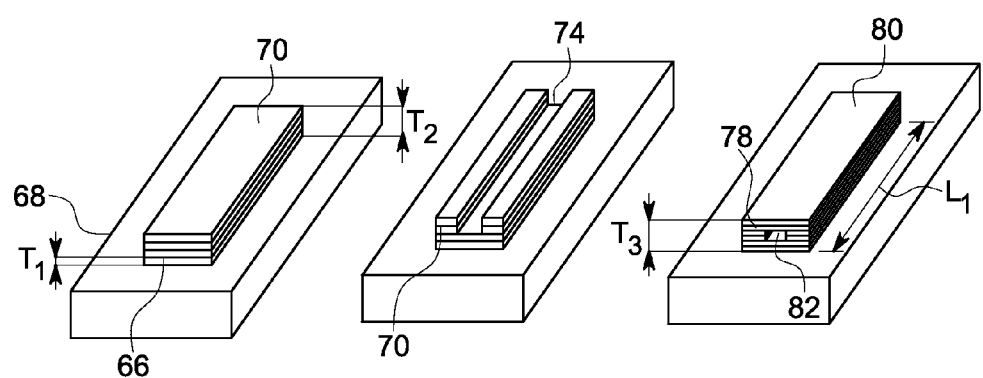
FIG. 3 is a diagrammatical illustration of an embodiment of a structure resulting from various steps of the method of FIG. 2.

The method 60 includes providing a backing material (e.g., a substrate), which may include a fiberglass reinforced polymer or any other non-conductive durable material, and a coil material, such as aluminum, copper, their respective alloys, or any other suitable conductive material (block 62). The method 60 also includes depositing a first plurality of sheets of the coil material onto the backing material and ultrasonically consolidating the first plurality of sheets of the coil material together to form a structure (block 64). For example, with reference to FIG. 3, the configuration resulting from the acts of block 64 are depicted. Moving from left to right, the diagram in FIG. 3 illustrates a first plurality of metal sheets 66 having a desired thickness $T_1$ deposited onto a substrate 68, according to the acts of block 64. The thickness $T_1$ of the first plurality of metal sheets 66 may be any suitable size, such as between 0.02 and 0.001 inches, 0.012 and 0.003 inches, 0.009 and 0.005 inches, or approximately 0.006 inches. The metal sheets may include any conductive material suitable for ultrasonic consolidation to produce a gradient coil. By way of example, such materials may include highly conductive metals such as 101 OFHC copper, aluminum, and their respective alloys, among others. By applying a suitable amount of force and ultrasonic vibrations (e.g., frequency approximately 20 kHz, and 10-50 μm amplitude) to each metal layer, the first plurality of metal sheets 66 are consolidated to form a first consolidated structure 70 having a thickness $T_2$ of approximately 1 to 10 mm.

Returning to the method 60 of FIG. 2, following consolidation of the first plurality of metal sheets, cooling channels are machined into the consolidated structure (block 72). In accordance with block 72, as depicted in the middle structure in FIG. 3, a cavity 74 is machined into the first consolidated structure 70. The cavity 74 may be used to generally define the size (e.g., cross-sectional area) of one or more internal cooling channels formed into the coil resulting from the method 60. Accordingly, the size of the cavity 74 will generally correspond to the size of the cooling channel. While any relative size is presently contemplated, by way of non-limiting example, the thickness of the cavity 74 may be at least approximately 10% of the thickness of the first consolidated structure 70, such as between approximately 10% and 90% of the thickness, between approximately 20% and 80% of the thickness, or between approximately 30% and 60% of the thickness of the first consolidated structure 70.

Returning again to the method 60 of FIG. 2, upon machining in accordance with block 72, the method 60 includes sealing the machined cooling channels by ultrasonically consolidating a second plurality of sheets of the coil material to the first plurality of sheets of the coil material (block 76). Referring again to FIG. 3, referring to the structure at the right, a second plurality of metal sheets 78 are consolidated to the first plurality of metal sheets 66 to form a second consolidated structure 80 having a thickness $T_3$ and a cooling channel 82, according to block 76. The second consolidated structure 80 may have a constant or changing cross section and have a desired length $L_1$ and thickness $T_3$.

Returning to FIG. 2, the method 60 also includes machining conductive channels into the sealed consolidated structure to produce a coil (block 84). For example, the machining performed in accordance with block 84 may produce one or more desired coil geometries, such as curves, bends, varying angles and turning radii, and so on. Various embodiments of such coils are discussed in detail below with respect to FIGS. 4-7, 9, and 10.

Before, during, or after forming the desired coil geometries, electrical connectors, jumpers, and cooling fluid connectors may be deposited onto the coil (block 86). For example, using ultrasonic consolidation, one or more connector features may be consolidated to the existing structure, obviating the use of solder, or other similar joint mechanisms. One embodiment of the manner in which such connection features may be formed is described in detail below with respect to FIG. 8.

Figure 4:
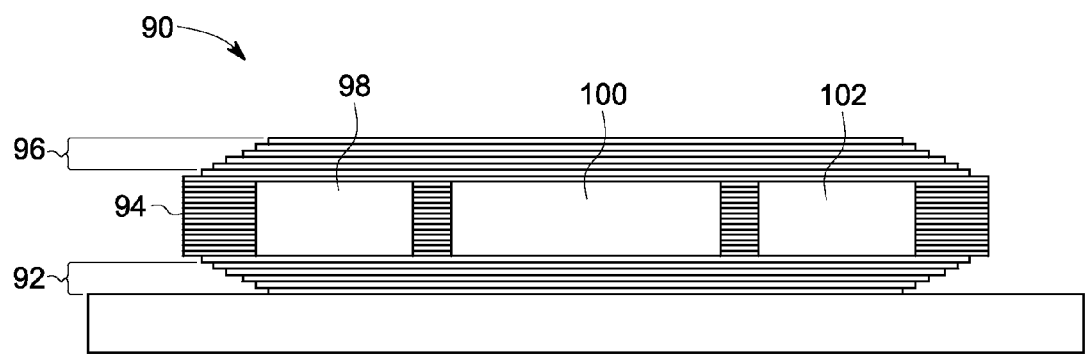
FIG. 4 is a diagrammatical illustration of an embodiment of an MRI gradient coil having cooling channels.

As noted above, coils having simple geometries (e.g., substantially straight or having relatively simple bends or turns)

or more complex geometries (e.g., a plurality of turns having different directions or geometries) may be produced according to the method 60 of FIG. 2. For example, in one embodiment, the method 60 of FIG. 2 may be used to produce a coil having a round cross-sectional geometry, as depicted in FIG. 4. Specifically, FIG. 4 illustrates an embodiment of a gradient coil 90 having variable cross sections and a round external geometry. As mentioned above, layers of metal sheets are deposited onto a substrate and consolidated with force and ultrasonic vibrations (e.g., an ultrasonic welder). In the illustrated embodiment, a plurality of layers having varying widths are consolidated to form the rounded geometry. The gradient coil 90 may be constructed by repeatedly consolidating a first plurality of metal sheets 92 having increasing widths, then consolidating a second plurality of metal sheets 94 of relatively fixed widths, and finally consolidating a third plurality of metal sheets 96 of decreased width. In other embodiments, the plurality of metal sheets may have a fixed width. Accordingly, after consolidation of each layer of the plurality of metal sheets the width is machined such that the desired coil geometry may be achieved. During the production process, a series of cooling channels 98, 100, and 102 are machined into the consolidated first and second plurality of metal sheets, 92, and 94.

Figure 5:
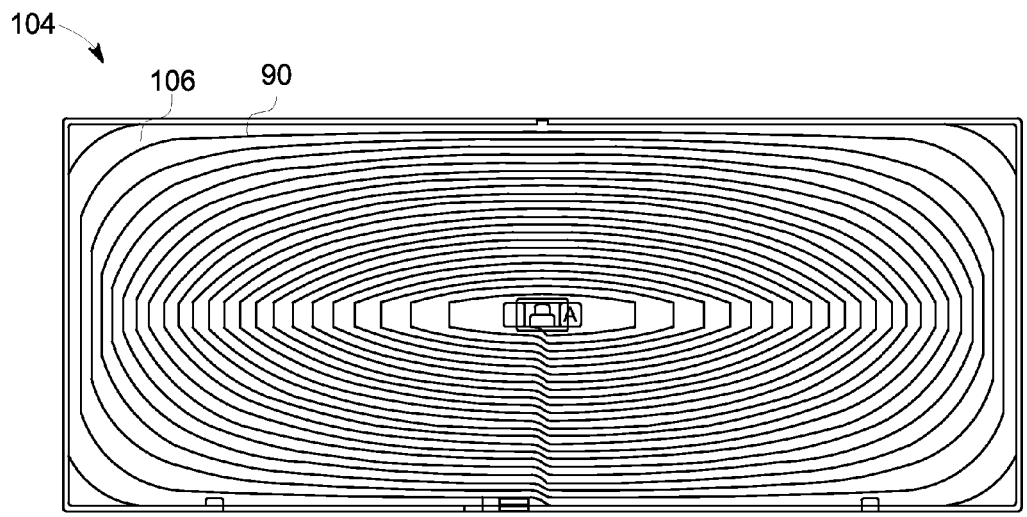
FIG. 5 is an illustration of an embodiment of an MRI gradient board having a gradient coil with variable turn spacing produced according to an embodiment of the present disclosure.

The geometry of the cooling channels 98, 100, and 102 may be equal, meaning each channel has the same dimensions, or they may have variable dimensions, where each channel has different dimensions, or a combination thereof. As such, a low profile hollow transverse gradient board with multiple cooling channels may be produced by optimizing the metal/cooling channel ratio along the gradient coil 90. Moreover, machining the cooling channels 98, 100, and 102 with variable dimensions accommodates a variable turn spacing 106 of the gradient board 104, as depicted in FIG. 5. In other words, as the gradient coil 90 reaches the turn spacing 106 on the gradient board 104 the cooling channels 98, 100, and 102 may get wider. Although FIG. 5 illustrates the gradient coil 90 in a parallel configuration, it is not limited to such a configuration and may adopt more complex patterns.

The cooling channels 98, 100, and 102 are sealed by consolidating the third plurality of metal sheets 96 to the second plurality of metal sheets 94 in a similar fashion as described above with respect to FIG. 3 to produce the gradient coil 90. In the case of the third plurality of metal sheets 96, the width of a first metal sheet from the third plurality of metal sheets 96 is equal to the width of the last metal sheet from the second plurality of metal sheets 94 and a last metal sheet of the third plurality of metal sheets 96 is equal to the width of a first metal sheet from the first plurality of metal sheets 92. It is appreciated that gradient coils possessing a rounded geometry will reduce the local electric field amplitude, thus improving the dielectric performance and Partial Discharge Inception Voltage of the gradient coil 90.

In another embodiment, the cooling channels 98, 100, and 102 may diverge or converge at the turn spacing of the gradient board 104. Such configuration may increase the amount of surface area of the cooling channels that is exposed to a coolant at the turn spacing, enabling more of the coolant to flow in an otherwise narrow cooling channel. Therefore, the cooling channels 98, 100, and 102 may maintain a constant flow of the coolant. In addition, the cooling efficacy throughout the gradient board may be improved.

Figure 6:
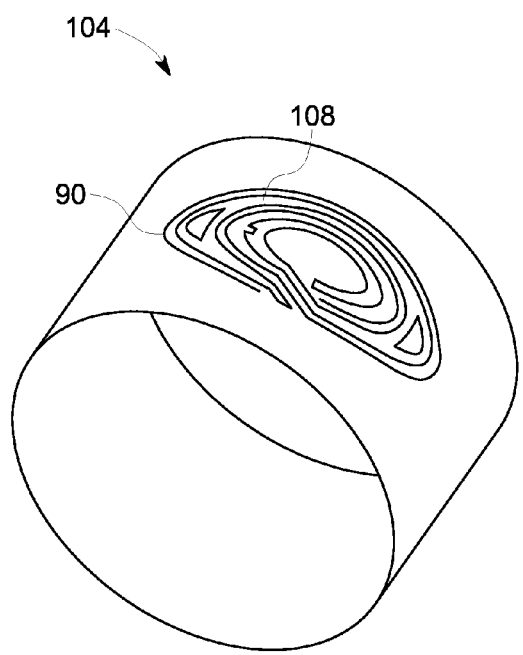
FIG. 6 is an illustration of an embodiment of an MRI gradient coil on a curved surface.

The method described above with respect to FIG. 2 may also be used to produce gradient coils on a cylindrical surface. For example, FIG. 6 depicts an embodiment of the gradient board 104 in which the gradient coil 90 with cooling channels 108 has been directly deposited and machined onto the gradient board 104. In other words, two or more conductive sheets have been consolidated onto a three-dimensional substrate, enabling an overall curvature in the geometry of the coil 90. Indeed, direct deposition and machining in this manner may provide flexibility in the geometry of the gradient coil 90 and the cooling channels 108, resulting in more compact coils. Further, the overall curvature of the coil 90 may more suitably conform to the particular type of machine in which the coil 90 may be used. The gradient board 104 may include any suitable metal clad material, such as a G10 material, such as fiberglass reinforced epoxy laminate, or a clad with a conductive metal (e.g. copper or aluminum). To produce the configuration illustrated in FIG. 6, the desired coil and cooling channel patterns are machined into the gradient board 104 followed by deposition and consolidation of a plurality of metal sheet layers relative to the machined patterns on the gradient board 104 to yield the gradient coil 90 and the cooling channels 108.

Figure 7:
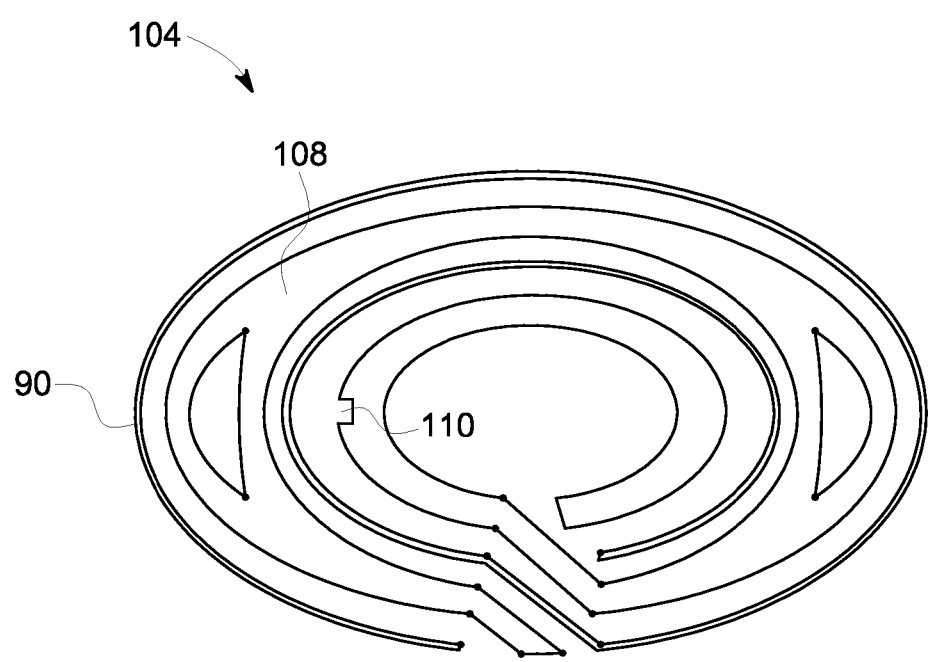
FIG. 7 is an illustration of an embodiment of an MRI gradient coil having inductor channels and diverging and converging cooling channels produced according to an embodiment of the present disclosure.

FIG. 7 is a planar view of the gradient coil 90 and the cooling channels 108 of the gradient board 104. In one embodiment, the cooling channels 108 are configured to converge and diverge to comply with narrow regions of the gradient board 104. The cooling channels 108 may be any suitable size, such as between approximately 3 mm and 20 mm wide. The cooling channels 108 can be a single cooling channel or a series of cooling channels constructed in such a way so as to enable a desired flow of cooling fluid through the channels and suitable contact between the cooling fluid and the surface of the gradient coil 90. Furthermore, the cooling channels 108 may include a turbulator 110 that cause the flow of the coolant to be turbulent, which may provide greater cooling of the gradient coils.

Figure 8:
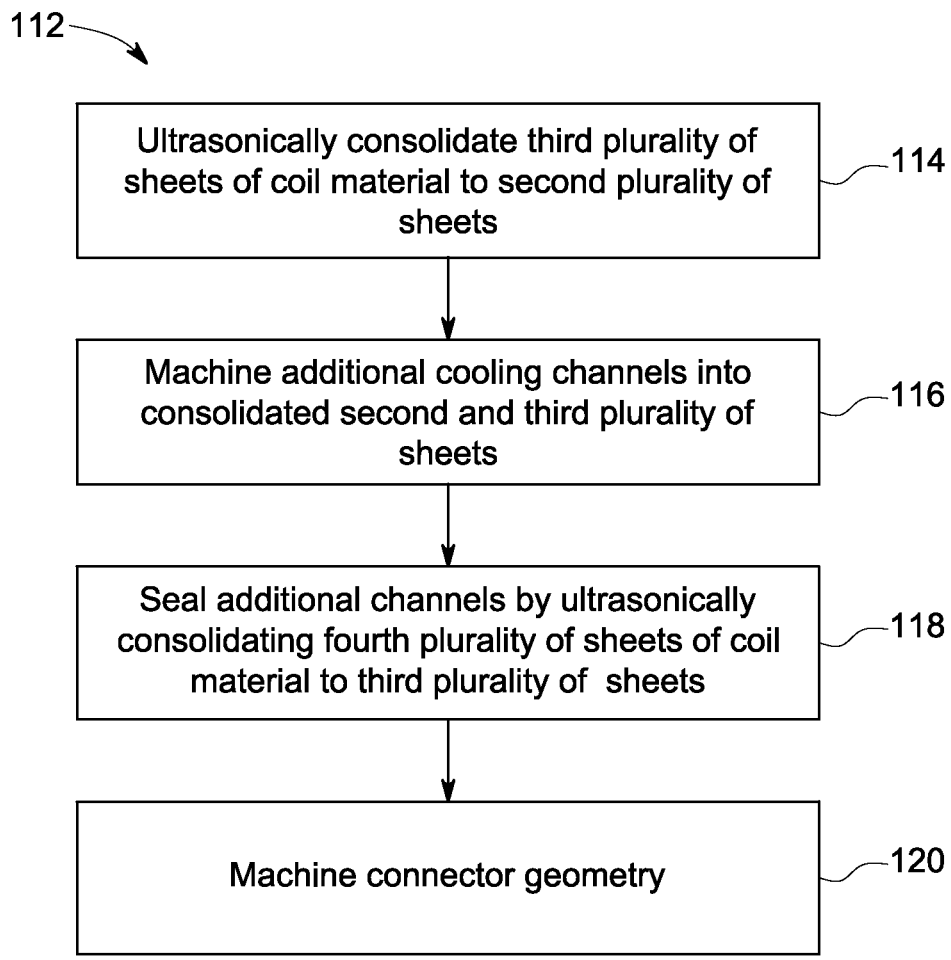
FIG. 8 is a process-flow diagram of an embodiment of a method for depositing electrical connectors and coolant plumbing onto an MRI gradient coil.

As noted above with respect to FIG. 2, jumpers, cooling connections, and other similar connectors may be formed using ultrasonic consolidation. Referring now to FIG. 8, a method 112 of manufacturing connectors that provide electrical current and/or coolant to gradient coils is illustrated. Because the method 112 may be performed as a part of, or subsequent to, the acts of the method 60 discussed above with respect to FIG. 2, similar language will be utilized to facilitate discussion. For example, in the method 60 of FIG. 2, at least a first and second plurality of conductive sheets are consolidated to form a coil geometry. Accordingly, in the present method 110 of FIG. 8, additional consolidations may be performed using a third plurality, a fourth plurality, and so on.

As depicted, the method 112 includes ultrasonically consolidating a third plurality of metal sheets to the second plurality of metal sheets 78 (FIG. 3) (block 114). The method 112 also includes machining additional cooling channels into the consolidated second and third plurality of metal sheets (block 116) for a cooling source (e.g. water, compressed gas, refrigerant) to enter and exit the cooling channels 82 (FIG. 3), 108 (FIGS. 6, 7). Furthermore, the method 112 also includes sealing the additional cooling channels by ultrasonically consolidating a fourth plurality of metal sheets to the third plurality of metal sheets (block 118). Finally, the method 112 includes machining a connector geometry into the plurality of consolidated metal sheets (block 120) to form a cooling and/or electrical connector, as depicted in FIGS. 9 and 10 described below.

Figure 9:
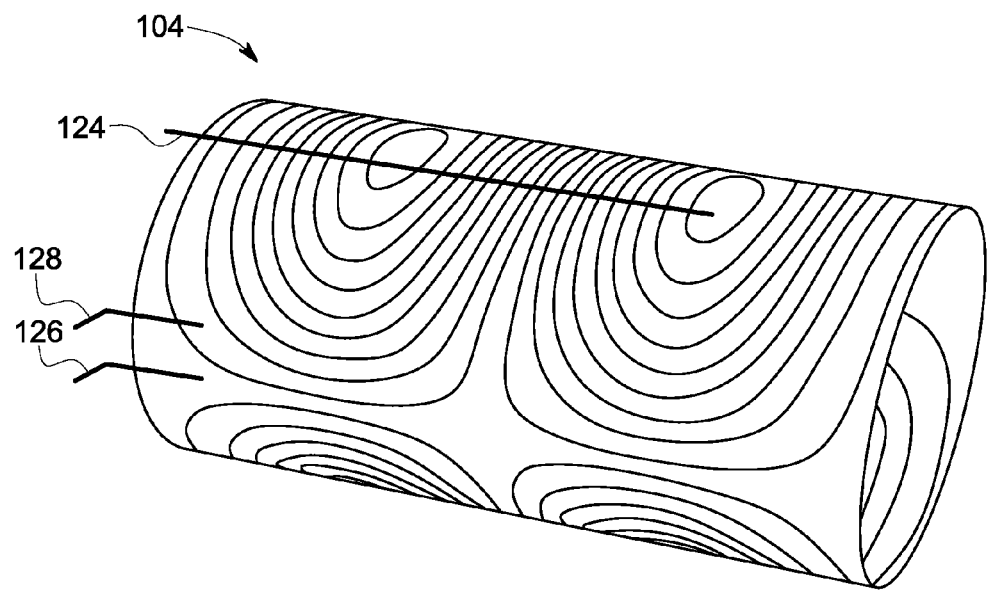
FIG. 9 is an illustration of an embodiment of an MRI gradient coil board having electrical connectors and coolant plumbing produced according to an embodiment of the present disclosure.
Figure 10:
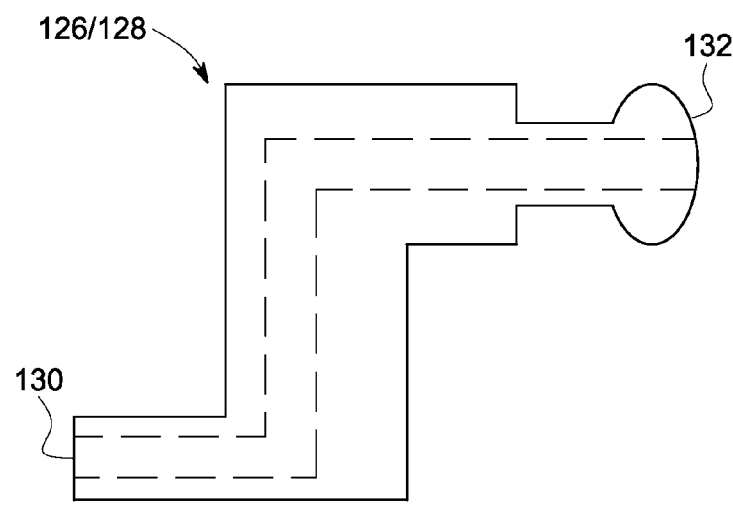
FIG. 10 is an illustration of an embodiment of a cooling channel connector produced according to an embodiment of the present disclosure.

Such a method allows the 3D deposition of features, such as electrical connector 124, inlet connector 126 and outlet connector 128 onto gradient coil board 104, as depicted in FIG. 9, without soldering and/or brazing the connectors, which may enhance durability. In regard to the electrical connector 124, a dielectric spacer may be disposed onto the gradient coils 90 prior to deposition of the electrical conductor 124 to prevent shorting between undesired portions of the coils 90 and to enable a defined flow of current through the coils 90. Thus, the dielectric spacer electrically isolates the gradient coil 90 from the electrical conductor 124, except at the points where electrical current is provided to and from the coils 90.

The connectors 126 and 128 may be machined to include internal fluid paths, so as to enable the flow of the coolant into the cooling channel 104. Furthermore, the connectors 126 and 128 may have machined patterns on a terminal end that are more conducive for securing with external cooling and/or electrical sources (block 120) (e.g., rounded edges). For example, FIG. 10 diagrammatically illustrates the connectors 126 and 128 with an internal cooling path 130 having a rounded terminal end 132 to facilitate connection with tubing from the cooling source. The terminal end 132 can be smooth or have internal or external threads, or a combination thereof, such that tube fittings may be used to secure the tubing from the cooling source to the connectors 126 and 128.

Figure 11:
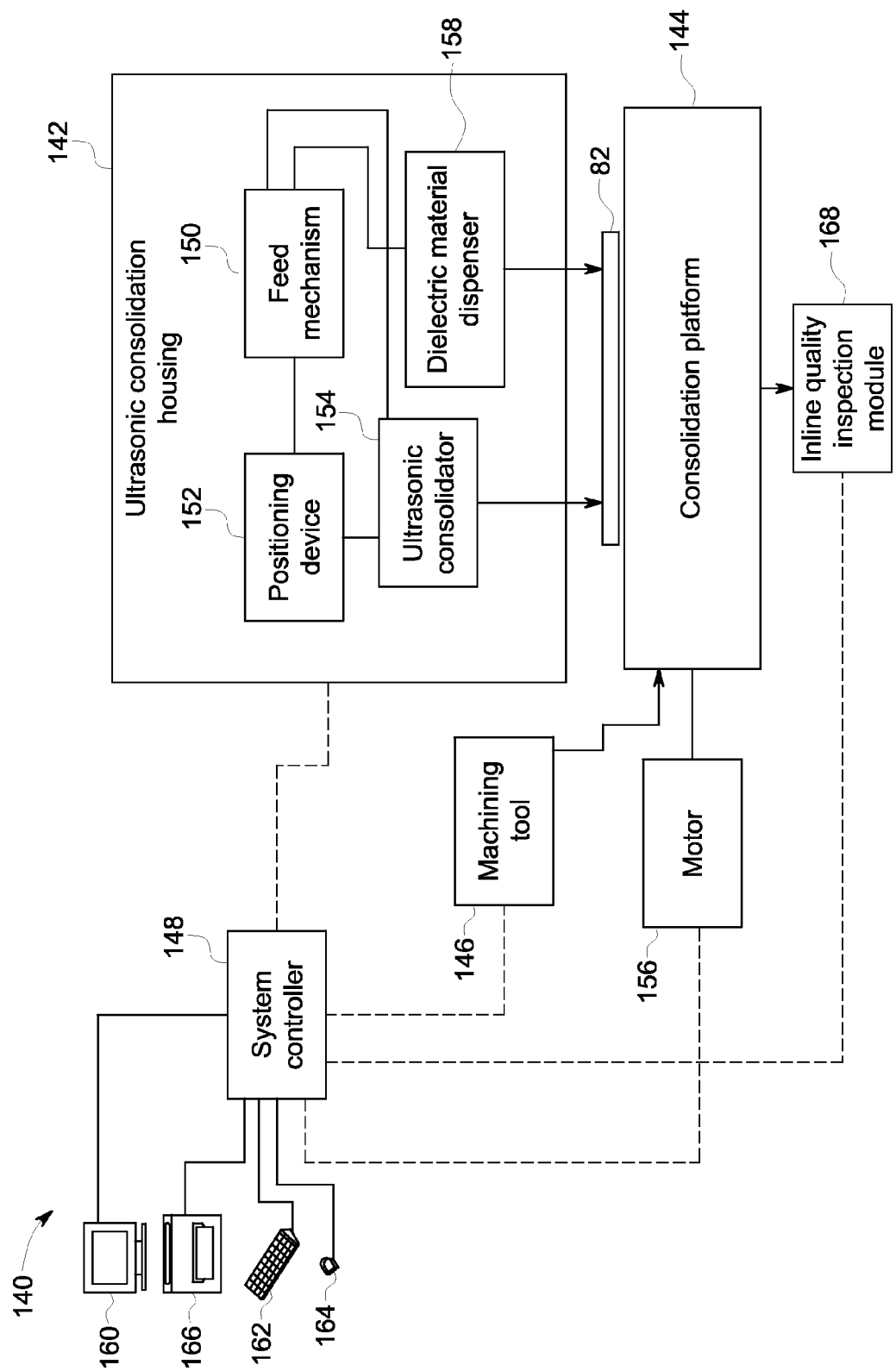
FIG. 11 is a diagrammatical illustration of an embodiment of an ultrasonic consolidation system used to manufacture MRI gradient coils.

As noted above, the embodiments described herein enable the manufacturing of gradient coils used in MRI systems using UC. One system that is able to produce these coils is depicted in FIG. 11. FIG. 11 is an embodiment of an ultrasonic consolidation system 140 that performs the methods of FIGS. 2 and 8. The ultrasonic consolidation system 140 includes an ultrasonic consolidation housing 142, a consolidation platform 144, a machining tool 146, and a system controller 148. The ultrasonic consolidation housing 142 further includes a feed mechanism 150, a positioning device 152, and ultrasonic consolidator 154. The feed mechanism 150 is configured to supply the positioning device 152 and/or the ultrasonic consolidator 154 with a plurality of electrically conductive sheets used to build a consolidated structure to form an inductor. The plurality of electrically conductive sheets may be any conductive material, including, but not limited to, metals such as aluminum, copper and/or their alloys, electrically conductive composite materials, or a combination thereof. The sheet may be in the form of a ribbon, tape, wire or any combination thereof. The positioning device 152 positions the ultrasonic consolidator 154 (e.g., an ultrasonic welding head) to a point on the substrate 82 supported by the consolidation platform 144 according to information received from the system controller 148. The ultrasonic consolidator 154 deposits the plurality of electrically conductive sheets, supplied by the feed mechanism 150, onto the substrate 82. The ultrasonic consolidator 154 applies force (approximately 1000-3000 N) and ultrasonic vibrations (e.g., frequency approximately 20 kHz, amplitude between 10 and 50 μm) to the plurality of electrically conductive sheets to consolidate each layer of the plurality of electrically conductive sheets and form an inductor.

The consolidation platform 144 is coupled to a motor 156, controlled by the system controller 148, which rotates and translates the consolidation platform 144 allowing construction of an inductor and cooling channels, in accordance with the present disclosure, on a curved surface. The machining tool 146 machines desired inductor and cooling channel patterns into the plurality of metal sheets consolidated by ultrasonic consolidator 154 according to information received from the system controller 148. In one embodiment, an MRI winding machine may be configured to include the features of the ultrasonic consolidation system 140. Such configuration enables the direct construction of inductor and cooling channels on a cylindrical substrate. Moreover, machining and deposition of inductor and cooling channels may be done on two boards simultaneously. Upon completion of the inductor and cooling channels, a dielectric material dispenser 158 deposits the dielectric spacer prior to deposition of the electrical conductor. The dielectric material dispenser 158 receives a dielectric material, such as but not limited to, ceramic, ceramic/epoxy composites, or any other suitable dielectric material from the feed mechanism 150.

The system controller 148 commands operation of the ultrasonic consolidating system 140 to construct the inductor having suitable cooling channels and connectors. For example, the system controller 148 may include devices employing a general purpose or an application-specific computer, both of which may typically include memory circuitry for storing gradient coil parameters such as inductor, cooling channel, connector geometries and patterns, and images (e.g., of a desired conductor configuration). The system controller 148 may also include a computer numerical controller (CNC) for the automated manufacturing of gradient coil boards. The CNC allows for accurate, automatic and repeatable construction of inductor and cooling channels (e.g. the same type of inductor and/or cooling channel can be made each time), thus improving quality control and the overall efficacy of the gradient boards. The system controller 148 may include a wide range of devices for facilitating interface between an operator and the ultrasonic consolidating system 140. In the illustrated embodiment, for example, the devices include a monitor 160, a conventional computer keyboard 162, and an alternative input device such as a mouse 164. A printer 166 is provided for generating hard copy output of inductor, cooling channel, and/or connector parameters, geometries, and images of gradient coil board designs. Furthermore, the system controller 148 may receive information indicative of the quality of the inductor and cooling channels from an inline quality inspection module 168. For example, the inline quality inspection module 168 may provide information about the conductor, coiling channel, and connector geometries to the control system 148, therefore the control system 148 may compare the received information to specification ranges stored in the memory circuitry and adjust the gradient coil parameters accordingly.

This written description uses examples to disclose the invention, including the best mode, and also to enable any person skilled in the art to practice the invention, including making and using any devices or systems and performing any incorporated methods. It should also be understood that the various examples disclosed herein may have features that can be combined with those of other examples or embodiments disclosed herein. That is, the present examples are presented in such a way as to simplify explanation but may also be combined with one another. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. An inductor, comprising:
a plurality of ultrasonically consolidated non-porous conductive layers defining a curved geometry having a compact radial thickness and configured upon a substrate such that the curved geometry is defined by the translation and rotation of a consolidation platform;
one or more internal fluid paths disposed within the curved geometry, integral with the plurality of ultrasonically consolidated non-porous conductive layers, and config- ured to flow a cooling fluid, the one or more internal fluid paths forming diverging and converging cooling channels at turn spacing; and one or more non-porous consolidated layers defining 3D electrical connectors incorporated on a planar or cylindrical surface.

2. The inductor of claim 1, wherein the fluid paths have a variable cross-section.

3. The inductor of claim 1, wherein the inductor is free of brazed or soldered joints.

4. A method of forming an inductor comprising the steps of:

ultrasonically consolidating a first set of a plurality of non-porous conductive layers to produce a first consolidated structure;

machining one or more internal fluid paths into the first consolidated structure to produce a machined first consolidated structure;

ultrasonically consolidating a second set of a plurality of conductive layers to the machined first consolidated structure to produce a second consolidated structure; and machining a curved geometry into the second consolidated structure, wherein the one or more internal fluid paths are disposed within the curved geometry, integral with the plurality of non-porous conductive layers, the one or more internal fluid paths forming diverging and converging cooling channels to flow a cooling fluid.

* * * * *